United States Patent
Chang et al.

(10) Patent No.: US 8,471,375 B2
(45) Date of Patent: Jun. 25, 2013

(54) HIGH-DENSITY FINE LINE STRUCTURE AND METHOD OF MANUFACTURING THE SAME

(75) Inventors: Chien-Wei Chang, Taoyuan (TW);
Ting-Hao Lin, Taipei (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 1423 days.

(21) Appl. No.: 11/772,208

(22) Filed: Jun. 30, 2007

(65) Prior Publication Data
US 2009/0001603 A1    Jan. 1, 2009

(51) Int. Cl.
*H01L 23/02* (2006.01)

(52) U.S. Cl.
USPC .......................................... 257/686

(58) Field of Classification Search
USPC ............................................ 257/686
See application file for complete search history.

(56) References Cited

U.S. PATENT DOCUMENTS

| | | | | |
|---|---|---|---|---|
| 4,692,839 A | 9/1987 | Lee et al. | | 361/386 |
| 4,901,136 A | 2/1990 | Neugebauer et al. | | 357/75 |
| 6,828,665 B2 * | 12/2004 | Pu et al. | | 257/686 |
| 6,953,994 B2 | 10/2005 | Kaewell, Jr. | | 257/724 |
| 2004/0201087 A1 * | 10/2004 | Lee | | 257/686 |

* cited by examiner

*Primary Examiner* — Jenny L Wagner

(57) ABSTRACT

A high-density fine line structure mainly includes: two boards with similar structures and a dielectric film for combing the two boards. Semiconductor devices respectively in two boards are opposite to each other after the two boards are combined. The two boards each include a fine line circuit, an insulated layer on the same surface, and the semiconductor device installed above the fine line circuit. The surface of the circuit, which is not covered by a solder mask, is made into a pad. The pad is filled with the tin balls for electrically connecting with another semiconductor device. Electroplating rather than the etching method is used for forming the fine line circuit layer, and a carrier and a metal barrier layer, which are needed during or at the end of the manufacturing process, are removed to increase the wiring density for realizing the object of high-density.

5 Claims, 6 Drawing Sheets

HIGH-DENSITY FINE LINE STRUCTURE AND METHOD OF MANUFACTURING THE SAME

BACKGROUND OF THE INVENTION

1. Field of the Invention

The present invention relates generally to a method of manufacturing a package structure, and in particular to a high-density fine line structure and method of manufacturing the same.

2. The Prior Arts

One of the important challenges in the IC industry is how to keep it under a proper cost for assembling various types of functions inside a limited package form effectively, so that chips performing different functions are to reach optimal performance. However, in the applications used in the digital, analog, memory, and wireless communications fields, etc, different electrical circuits having different functionalities can produce different performance requirements and results corresponding to the production technology. Therefore, a single chip having many integrated functions may not provide the most optimal solution. As the SOC, SiP, PiP (Package-in-Package), PoP (Package-on-Package), and stack CSP technique have rapidly advanced, it can be predicted that the most capable system chip is a packaged system which can make the most of the space allowed to integrate various chips having different functions under the various different technologies and different voltage operation environments.

In detail, the system-in-package (SIP) is a package in which chips of various IC types are assembled. A new technique which is developed from the SIP is able to stack many chips inside a package module, and able to provide or integrate more functions or higher density by utilizing the third dimensional space. The stack CSP product firstly launched to the public is memory combo, and is able to stack six layers of memory chips in a BGA package. Herein, apart from the conventional wire bonding, the solder bumps or the flip-chip technique can also be used, while the interposers can be added to assist stacking, or perhaps the heat extraction can also be gradually applied.

A package of the stack chips should include dies as the building blocks which are separated from each other, but are connected with each other by conducting wires, and may include the stack of one or more memory chips, an analog chip stacked on another SOC or digital chip, and also another separate RF chip disposed on a multi-layer interconnected substrate, where these chips have different control and I/O (input/output) paths. Moreover, if there is a memory in the stacked chip, the control software can write into the non-volatile memory (NVM).

However, because the conventional fine line technique is unable to achieve any major breakthrough in technology, the manufacturing process for fabricating the more complicated package structure as described above cannot yield greater further overall package volume reductions, for meeting the growing thinner and lighter requirements of the electronic devices.

In the conventional manufacturing of the 50 μm fine pitch line circuit on the build up material such as the glass-fiber-reinforced resin material, the method includes using a 1.5-5.0 μm thin copper as the conductive layer for the pattern plating, and flash etching is performed to etch the thin copper layer with thickness of 1.5-5.0 μm. Because a rough surface of the thin copper layer is required to be combined with the glass-fiber-reinforced resin material, the rough surface structure of the thin copper layer is therefore required in the corresponding method. According to the structure, the etching operation as required is to lead to increased etching depth for processing, thereby resulting in the damage to the wire width after plating. Due to the thickness of the thin copper layer, the etching amount may not be reduced further, and therefore, high-density board having a thinner fine pitch lower than 50 μm can not be manufactured.

During plating of the nickel on the fine line circuit layer of the printed circuit board, the electrical current is transmitted into the board, and especially for the fine line circuit layer required to be electroplated, it is necessary that the electrical current may be transmitted by the conductor trace lines which are connected with the fine line circuit layer. Although the fine line circuit layer can be fully covered using the plated nickel layer by this method, the conductor trace lines are still retained in the printed circuit board after the plating, and thereby occupy the limited wiring density. In order to decrease the wiring density, the width of the conductor trace line becomes relatively narrowed, and the thickness of the plated nickel layer may not be uniform; therefore, the decrease of the width of the conductor trace line may not be suitable for use for increasing the wiring density.

In order to improve electrical performance and reducing interference, and at the same time, to increase the wiring density, the printed circuit boards currently are designed without the conductor trace lines, and the adhesion of the wire bonding region may be optimized by nickel plating the nickel, rather than by using the chemical nickel plating (or the chemical gold plating) whose reliability is not as good. Therefore, the wire bonding region made without conductor trace lines but using nickel plating method are typically manufactured by the GPP operation.

However, before performing the GPP operation, because the plated nickel layer is formed before the solder mask (SM), the area of the plated nickel layer occupied under the SM is relatively large. Because the adhesion between the SM and the plated nickel layer is poor, the relatively high requirement for reliability and thermal stability today is unable to be met by the conventional manufacturing methods.

In other manufacturing methods such as in the non-plating line (NPL) method, besides having a complex set of procedures, a specialized machine is required for use for plating the thin copper layer, and the etching parameters for the etching are difficult to control after plating the thin copper; as a result, micro shorts are often created during manufacturing, or occurring during reliability testing, resulting in unmanageable situations.

No matter which type of NPL manufacturing method is used, the fine line layer is to be defined by the un-etched metal layer, and sometimes to rely on the selective etching of the metal layer. But, according to the conventional method, the etching cannot be controlled accurately; therefore, the manufacturing of the fine line circuit cannot rely reliably upon etching, otherwise the fine pitch line circuit faces tremendous development barrier.

SUMMARY OF THE INVENTION

A primary objective of the present invention is to provide a high-density fine line structure and method of manufacturing the same. In the invention, without using etching as the method for forming the circuit, only the patterned photoresist layer is used to define the location of the fine line layer, and the plating method is used to form the fine line layer (the plating electrical current is transmitted by a removable carrier or a metal barrier layer hereon), and to form the fine line circuit for realizing the thinning effect. Later, the carrier and the metal barrier layer may be removed during or at the end of the manufacturing process to increase the wiring density for realizing the higher-density objective. Meanwhile, the higher-cost semi-additive process (SAP) technique is also not used in the present invention.

Based upon the above objective, the solution of the present invention is to provide a high-density fine line structure, which includes two boards with similar structures and a dielectric film for combining the two boards. Semiconductor devices respectively in the two boards are opposite to each other after the two boards are combined. The boards each include a fine line circuit, an insulated layer on the same surface as the fine line circuit, and the semiconductor devices installed above the fine line circuit. The surface of the circuit, which is not covered by a solder mask, is made into a pad. The pad is filled with tin balls for electrically connecting with another semiconductor device. Electroplating rather than etching method is used for forming the fine line circuit layer, and a carrier and a metal barrier layer, which are needed during or at the end of the manufacturing process, are removed to increase the wiring density for realizing the object of high-density.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1A:
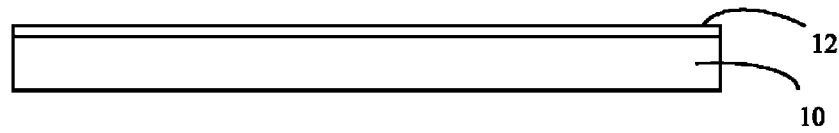
FIGS. 1A-1F are cross-sectional views showing the installation of a semiconductor device in accordance with the present invention.
Figure 1B:
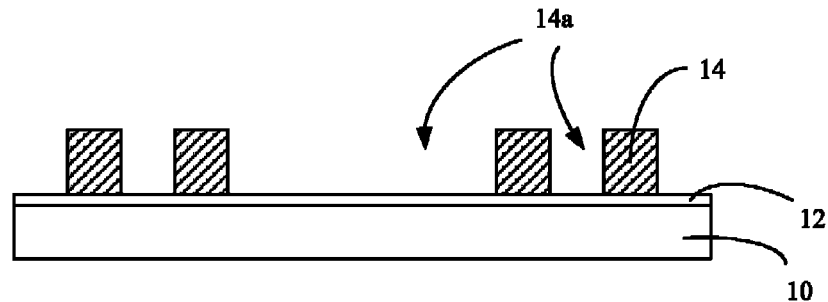
Figure 1C:
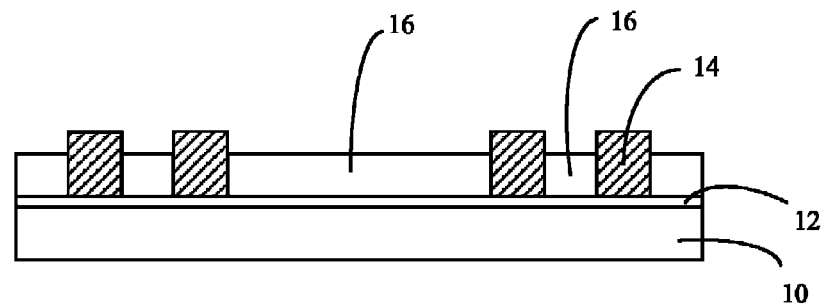
Figure 1D:
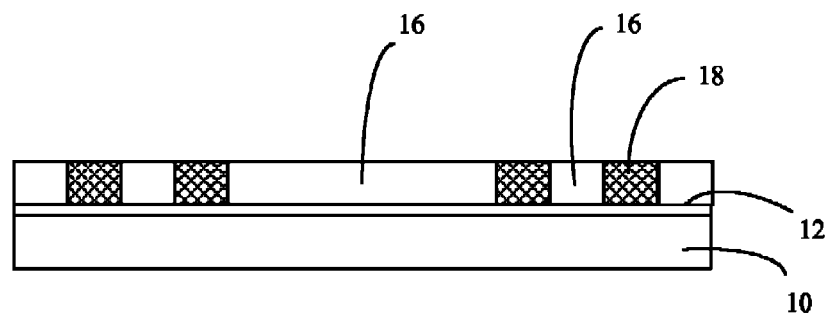
Figure 1E:
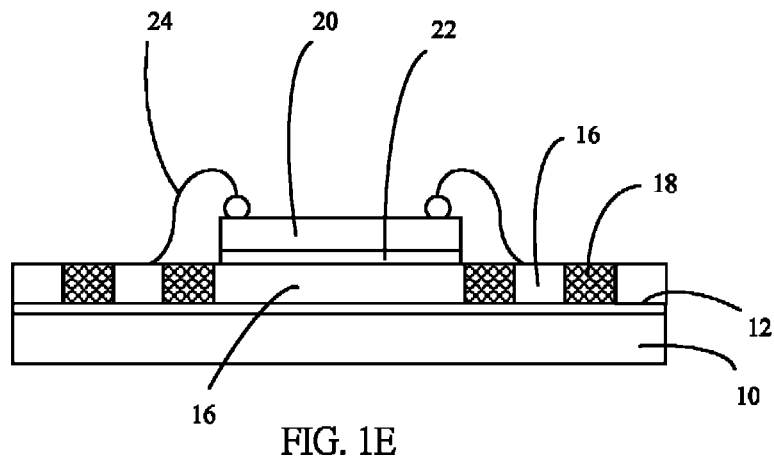
Figure 1F:
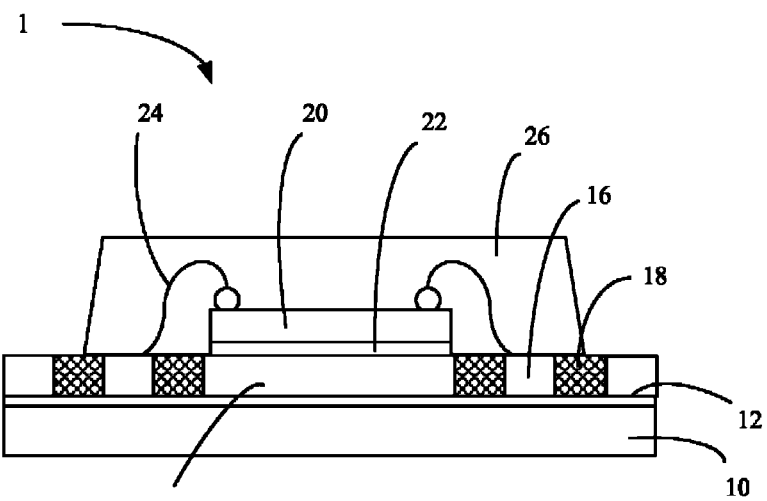

With reference to the drawings and in particular to FIGS. 1A-1F, the installation of a first semiconductor device in accordance with the present invention is shown, in which the part for forming the circuit without etching is shown in FIGS. 1A-1D, and the part for installing the first semiconductor device 1 is shown in FIGS. 1E-1F.

Figure 2:
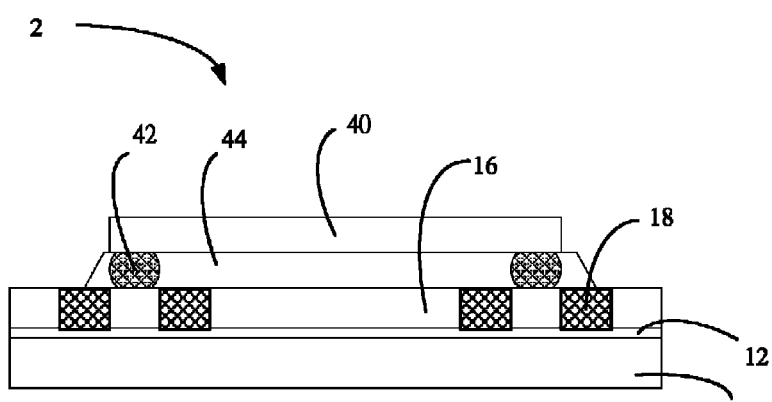
FIG. 2 is a cross-sectional view showing the installation of another semiconductor device in accordance with the present invention.

With reference to FIG. 2, the installation of a second semiconductor device 2 is completed by processing again the steps shown in FIGS. 1A-1F.

With reference to FIGS. 3A-3D, a manufacturing method of a high-density fine line structure provided in accordance with the present invention is shown.

Figure 3A:
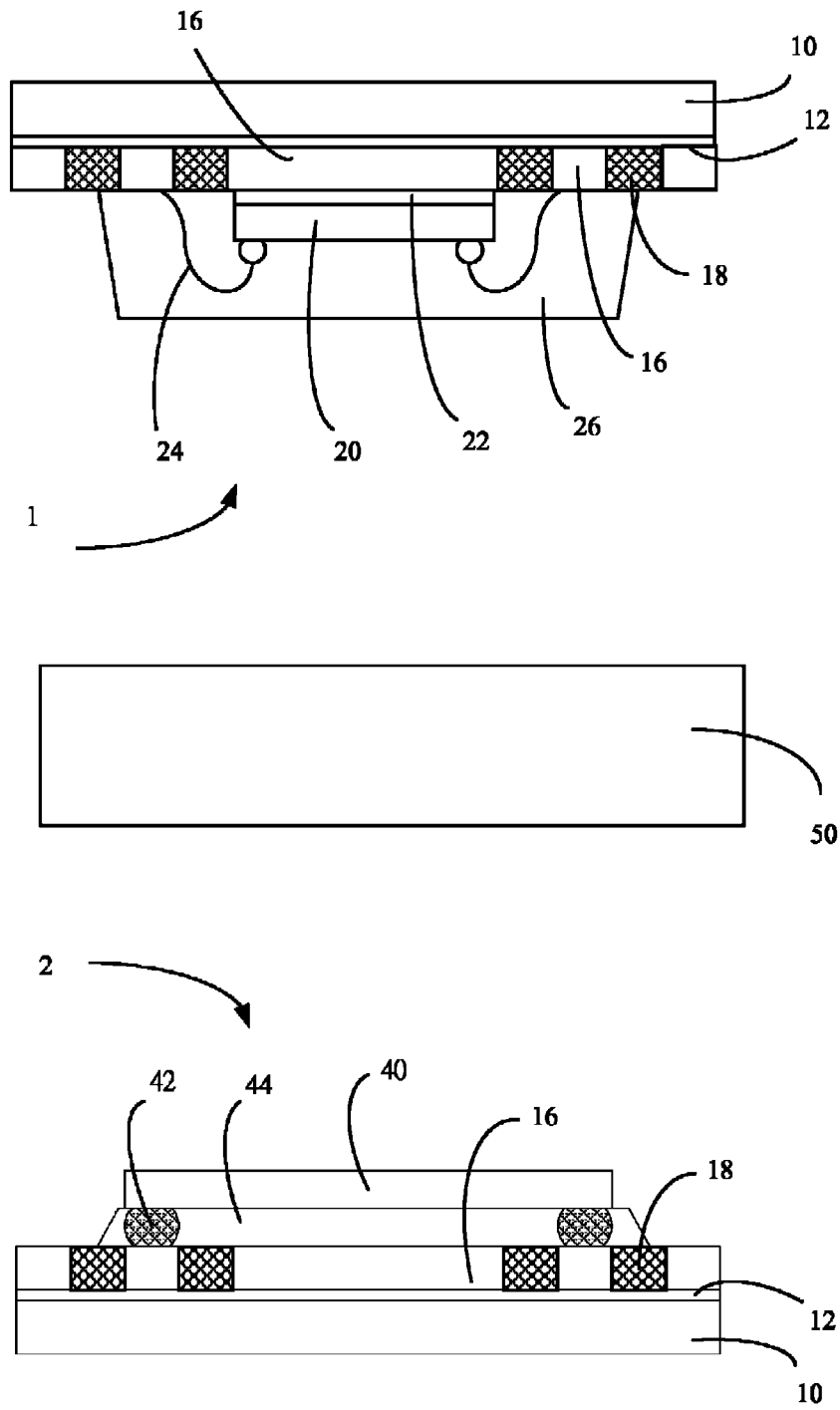
FIGS. 3A-3D are cross-sectional views showing a manufacturing method of a high-density fine line structure in accordance with the present invention.
Figure 3B:
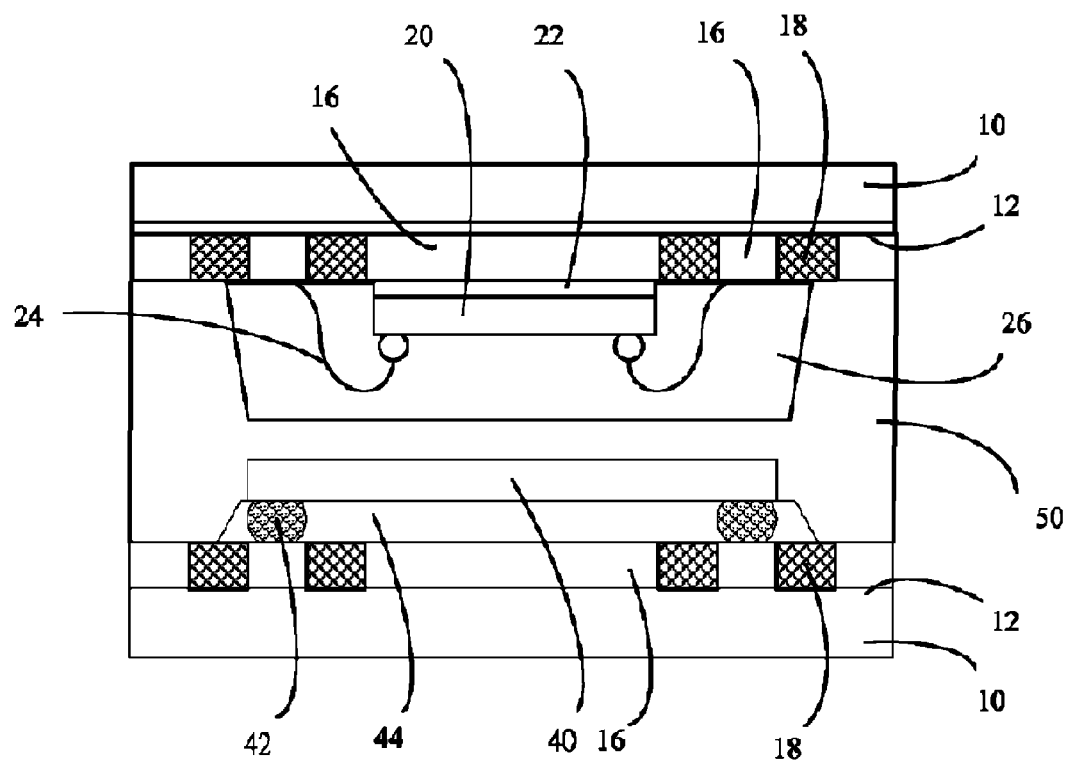
Figure 3C:
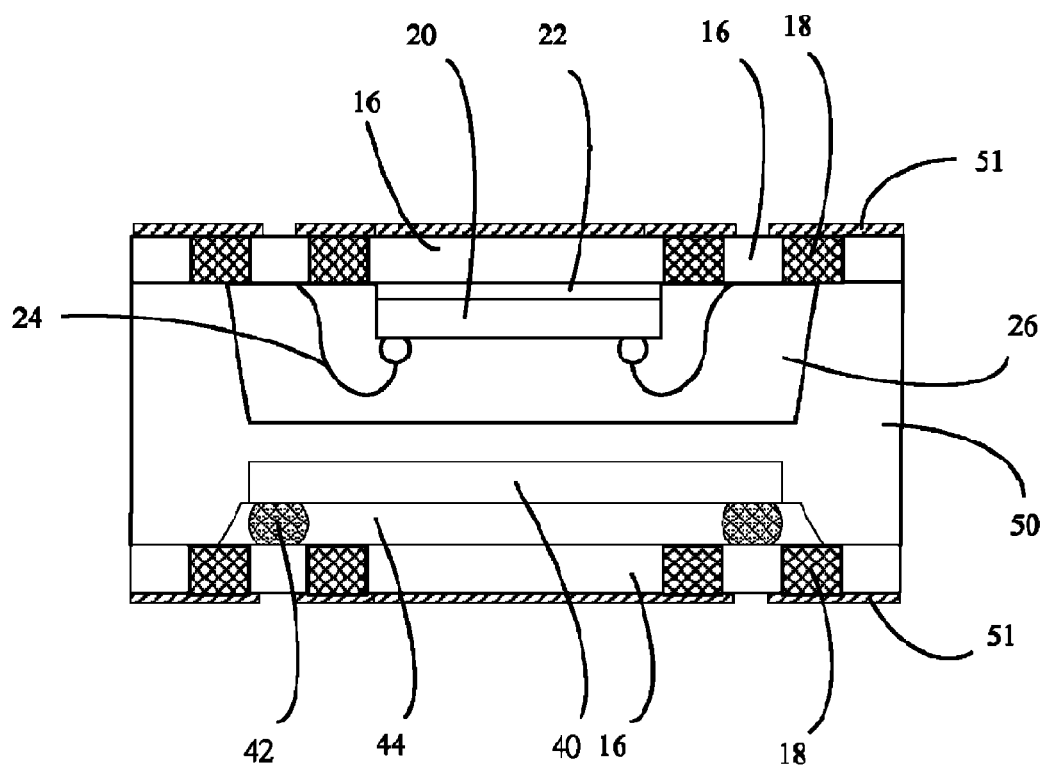

Referring to FIG. 3A, the high-density fine line structure and method of manufacturing the same provided in the present invention, mainly comprises a first board 1 and a second board 2 combined together to form a single board as shown in FIG. 3C, to increase the wiring density for realizing the high-density objective. As shown in FIGS. 1A-1F, to manufacture the board 1 and the board 2, electroplating rather than the etching method is used for forming a fine line circuit layer 16 needed in the board 1 and board 2, and then a carrier 10 and a metal barrier layer 12 (as shown in FIG. 3C) are removed during the process or at the end of the manufacturing process, to increase the wiring density for realizing the object of the high-density.

Below, the structures of the board 1 and the second board 2 and the method of combining the two boards to form a single board are described at first, and the manufacturing method of the fine line circuit layer 16 is described later.

As show in FIG. 3A, the first board 1 and the second board 2 with similar structures, each comprise a fine line circuit 16, an insulated layer 18 on the same surface as the fine line circuit 16, and a first semiconductor device 20 and a second semiconductor device 40 installed above the fine line circuit 16.

Figure 3D:
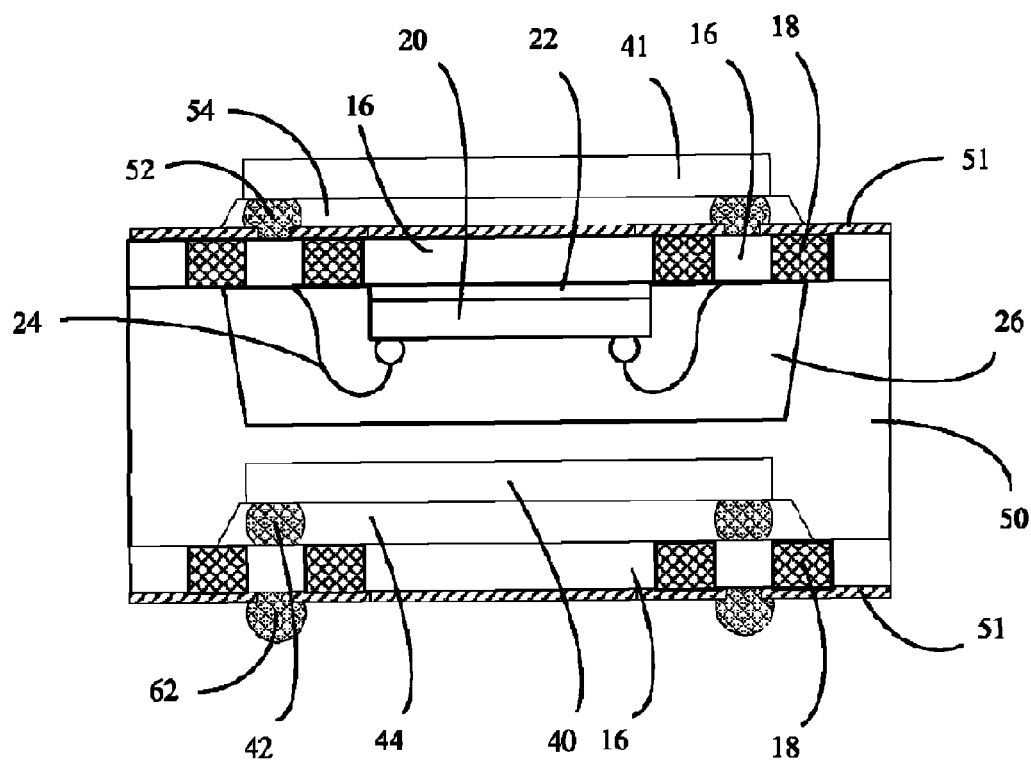

In order to let the first semiconductor device 20 in the first board 1 and the second semiconductor device 40 in the second board 2 be opposite to each other after the first board 1 and the second board 2 are combined to be the single board, the first board 1, a dielectric film 50 and the second board 2 are stacked together in sequence. Then, as shown in FIG. 3B, the first board 1 and the second board 2 are combined to be the single board by using the dielectric film 50. Thus, the carrier 10 and the metal barrier layer 12 may be removed to expose the fine line circuit layer 16 as shown in FIG. 3C, to increase the wiring density for realizing the objective of the high-density. The furthest outer fine line circuit layer 16 can be a tin ball pad, as is used for filling in a tin ball 52, for ease to install on the other circuit boards or the other semiconductor device 41, as shown in FIG. 3D. Besides, if the first semiconductor device 20 and the second semiconductor device 40 are required to be conducted, a metal via post (not shown) can be formed in the dielectric film 50.

Before filling in the tin balls 52 and 62, a solder mask 51 is selectively formed above the fine line circuit layer 16 of the first board 1 and the second board 2. The part of the fine line circuit layer 16, which is not covered by the solder mask 51, may be made into the pad.

Specially, in this structure, the fine line circuit layer 16 may be a plurality of layers, and at the furthest outer layer of the fine line circuit layer 16, besides the installation of the third semiconductor device 41, the passive device (not shown) may also be installed. Moreover, during installing the first semiconductor device 20, the second semiconductor device 40 and the third semiconductor device 41 on the fine line circuit layer 16, the third semiconductor device 41 can be installed by using the wiring or the flip chip. Below, the manufacturing method of the fine line circuit layer 16 may be further described.

In detail, as shown in FIG. 1C, the high-density fine line structure and method of manufacturing the same provided in the present invention mainly includes: the metal barrier layer 12 (or the carrier 10 itself) by which the plating current can be transmitted so that the fine line circuit layer 16 may be formed without etching (which is only attainable through the capability of manufacturing finer detailed circuits). The position of the fine line circuit 16 is defined by the patterned photoresist layer 14, and then the fine line circuit 16 is formed by the plating method, so as to improve the fabrication capability of the fine pitch for meeting the needs of the first semiconductor device 20 having many I/Os. In addition, the carrier 10 and the metal barrier layer 12 are removed at the end of the process for increasing the wiring density for realizing the high-density IC packaging objective. Meanwhile, the semi-additive process (SAP), which has higher cost associated, may not be required to be used in the present invention for manufacturing the fine line circuit.

As shown in FIGS. 1A-1D, the metal barrier layer 12 is first formed on the carrier 10, in particular as shown in FIG. 1A. For forming the fine line circuit layer 16 as shown in FIG. 1B, the patterned photoresist layer 14 is formed above the metal barrier layer 12 (whose photoresist opening 14a is for forming the circuit). And as shown in FIG. 1C, plating current is transmitted through the metal barrier layer 12, and then the fine line circuit layer 16 may be formed on the metal barrier layer 12 in the photoresist opening 14*a*. Thus, the patterned photoresist layer 14 is removed.

After the formation of the fine line circuit layer 16, the insulated layer 18 may be filled adjacent to the fine line circuit layer 16 on the metal barrier layer 12, as show in FIG. 1D.

Before filling in the insulated layer 18, in order to improve the reliability of the adhesive between the fine line circuit layer 16 and the filled insulated layer 18, the surface of the fine line circuit 16 may be processed first to increase the surface area and the degree of roughness of the fine line circuit layer 16. The surface processing can be performed by roughening the surface of the fine line circuit 16 or by forming a plurality of copper micro-bumps (or nodules) on the surface. Whatever the method is used, the purpose is that the fine line circuit layer 16 can remain firmly adhered to the insulated layer 18 and other package components due to the increased contact surface area, after removing the carrier 10 and the metal barrier layer 12 which were used to support the fine line circuit layer 16 as shown in FIG. 3C.

As shown in FIG. 1E, the first semiconductor device 20 is formed on the fine line circuit layer 16. The device operation reliability is improved with the help of the first semiconductor device 20 to disperse the heat if a sufficient area is provided and the surface is processed properly.

During the mounting of the first semiconductor device 20 on the fine line circuit layer 16, the first semiconductor device 20 may be installed using wire bonding as shown in FIGS. 1E-1F or the flip chip as shown in FIG. 2. When using the wiring bonding as shown in FIG. 1E, the first semiconductor device 20 may be adhered to the copper surface by using the heat conductive adhesive 22, and the conductor trace line 24 may be connected with the terminals of the first semiconductor device 20 on the predetermined fine line circuit layer 16 by using the wiring bonder machine. Then the first semiconductor device 20 and the conductor trace line 24 may be encapsulated by using an adhesive 26, as shown in FIG. 1F.

As shown in FIG. 2, when using the flip chip for mounting the second semiconductor device 40, the tin balls 42 are electrically connected with the fine line circuit layer 16, and the area around the tin balls 42 are filled using the adhesive 44. As shown in FIG. 3D, when using the flip chip for mounting the third semiconductor device 41, the area around the tin balls 52 are electrically connected with the fine line circuit layer 16, and the tin balls 52 are filled using the adhesive 54.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A high-density fine line circuit structure, comprising:
    a first board, comprising:
        a first fine line circuit layer;
        a first insulating layer, formed on a same surface as the first fine line circuit layer; and
        a first semiconductor device, installed on the first fine line circuit layer;
    a second board, comprising:
        a second fine line circuit layer;
        a second insulating layer, formed on a same surface as the second fine line circuit layer; and
        a second semiconductor device, installed on the second fine line circuit layer; and
    a dielectric layer formed between the first board and the second board for combining the first board and the second board to be a combined single board with the first and second semiconductor devices being embedded in the dielectric layer between the first and second boards;
    wherein the first or second fine line circuit layer of the first board or the second board has portions exposed on an outer surface of the combined single board for serving as tin ball pads on which tin balls are formed.

2. The structure as claimed in claim 1, further comprising: a solder mask, formed to selectively cover the outer surface of the combined single board to provide the exposed portions for serving as the tin ball pads.

3. The structure as claimed in claim 1, wherein tin balls are formed on the exposed portions of the first or second fine line circuit layer and electrically connected with a third semiconductor device.

4. The structure as claimed in claim 3, wherein the third semiconductor device is installed on the outer surface of the combined single board and connected with the first or second fine line circuit layer by using wire bonding or flip chip.

5. The structure as claimed in claim 1, wherein the first semiconductor device or the second semiconductor device is installed on the first or second fine line circuit layer by using wire bonding or flip chip.

* * * * *